United States Patent
Beardmore

[11] Patent Number: 6,121,766
[45] Date of Patent: Sep. 19, 2000

[54] CURRENT SENSOR ASSEMBLIES

[75] Inventor: Geoffrey Beardmore, Gloucestershire, United Kingdom

[73] Assignee: Smiths Industries Public Limited Company, London, United Kingdom

[21] Appl. No.: 09/051,142

[22] PCT Filed: Nov. 11, 1996

[86] PCT No.: PCT/GB96/02773

§ 371 Date: Oct. 14, 1998

§ 102(e) Date: Oct. 14, 1998

[87] PCT Pub. No.: WO97/17616

PCT Pub. Date: May 15, 1997

[30] Foreign Application Priority Data

Nov. 9, 1995 [GB] United Kingdom ............... 9522998

[51] Int. Cl.$^7$ ........................................ G01R 5/26
[52] U.S. Cl. ................................. 324/106; 324/105
[58] Field of Search .......................... 324/104, 105, 324/106, 126, 117 R, 95

[56] References Cited

U.S. PATENT DOCUMENTS 3,696,294 10/1972 Krupka ........................... 324/105
4,695,793 9/1987 Katzmann ....................... 324/106
4,789,823 12/1988 Delfs et al. ....................... 324/95

Primary Examiner—Safet Metjahic
Assistant Examiner—Minh N. Tang
Attorney, Agent, or Firm—Pollock, Vande Sande & Amernick, R.L.L.P.

[57] ABSTRACT

A current sensor assembly of planar form arranged for connection in series with an electrical circuit. The circuit includes a first and second conductor. The sensor assembly includes a first conductive member adapted to contact the second conductor in the circuit. A second conductive member is adapted to contact the second conductor in the circuit. A thin layer of conductive material is connected at one end to the first conductive member and at is other end to the second conductive member so that current flow in the circuit between the first and second conductors is via the thin layer. A support supports the thin layer along its entire length. At least a part of the support contacts the thin layer is electrically insulative. The thermal conductivity of the support is different at different points along the length of the layer so that heat disposition is different at the different points and hence the temperature rise caused by current flow through the layer is different. A plurality of temperature sensors are located to sense the temperature of the layer at the different points. The assembly provides an output representative of current from the outputs of the temperature sensors.

6 Claims, 2 Drawing Sheets

CURRENT SENSOR ASSEMBLIES

BACKGROUND OF THE INVENTION

This invention relates to current sensor assemblies of planar form arranged for connection in series with an electrical circuit, the assembly including a first conductive member adapted to contact a first conductor in the circuit, a second conductive member adapted to contact a second conductor in the circuit, a third member of conductive material connected at one end to the first conductive member and at its other end to the second conductive member such that current flow in the circuit between the first and second conductors is via the third member, third member being arranged so that the temperature rise at different parts of the member caused by current flow through the layer is different, the assembly including a plurality of temperature sensors located to sense the temperature of the third member at the different parts, and the assembly providing an output representative of current from the outputs of the temperature sensors.

There are many applications where it is desirable to monitor current in electrical equipment and systems. Knowledge of current and power consumption can enable power supply to be managed in the most effective way and can enable the detection of faults. Although current sensors are available, they are generally expensive and bulky. In FR-A-548895 there is described a current sensor having a self-supporting conductive strip extending between two terminals, the resistance of the strip being measured as its temperature changes under the effect of current flow.

SUMMARY OF THE INVENTION

It is an object of the present invention to provide an improved current sensor assembly.

According to the present invention there is provided a current sensor assembly of the above-specified kind, characterized in that the third conductive member is a thin planar layer supported along its entire length by a support and at least a part of the support in contact with the planar layer is electrically insulative.

Parts of the support are preferably of different thermal conductive at different points along the length of the planar layer so that heat dissipation is different at the different points. A part of the support may be diamond. The first and second conductive members may be planar members located on opposite sides of the assembly. The sensor assembly may have an aperture extending through the first and second conductive members and adapted to receive a terminal post projecting from the first conductor, the second conductive member being electrically insulated from the terminal post by an electrically-insulative collar in the aperture. The sensor assembly may include three temperature sensors, the planar layer of conductive material being arranged so that the temperatures $t_1$ and $t_2$ at opposite ends are less than the temperature $t_3$ at a point between its ends, the assembly including a circuit for calculating $t_3-(t_1+t_2)/2$ and for deriving an indication of current accordingly. The output representative of current may be provided via the electrical circuit itself.

A current sensor assembly according to the present invention will now be described, by way of example, with reference to the accompanying drawings, in which:

DETAILED DESCRIPTION OF THE INVENTION

Figure 1:
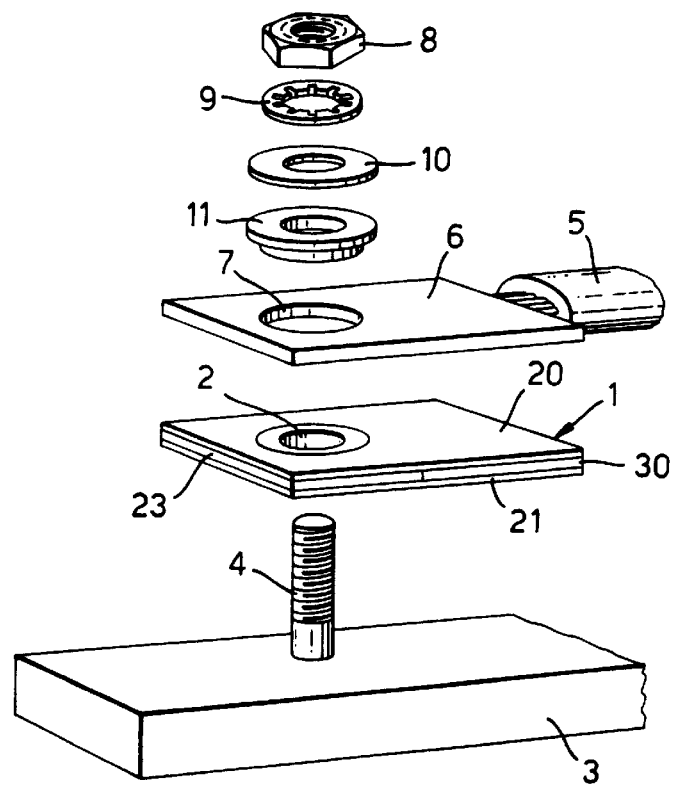
FIG. 1 is an exploded perspective view of the sensor assembly in a part of a circuit.

With reference first to FIG. 1, the sensor assembly 1 is a tag of planar form and rectangular shape with a circular aperture 2 through its thickness, close to one end. The assembly 1 is secured to a first conductor 3 by means of a threaded terminal post 4 projecting upwardly from an upper surface of the conductor, through the aperture 2. The first conductor 3 is a power line formed by a metal bar of rectangular section having a flat upper surface at least as wide as the sensor, so that the entire lower surface of the sensor assembly is in electrical contact with the conductor. The circuit is completed by a second conductor in the form of a flexible cable 5 and metal connector pad 6 at one end of the cable. The pad 6 has the same shape and size as the assembly 1 and has an aperture 7 in a location corresponding to the aperture 2 in the sensor assembly. The pad 6 and the sensor assembly 1 are clamped to the conductor bar 3 by means of a nut 8, a locking washer 9, a metal washer 10 and an insulating washer 11. The arrangement is such that current flows from bar conductor 3 to the cable 5 via the sensor assembly 1 or in the opposite direction.

Figure 2:
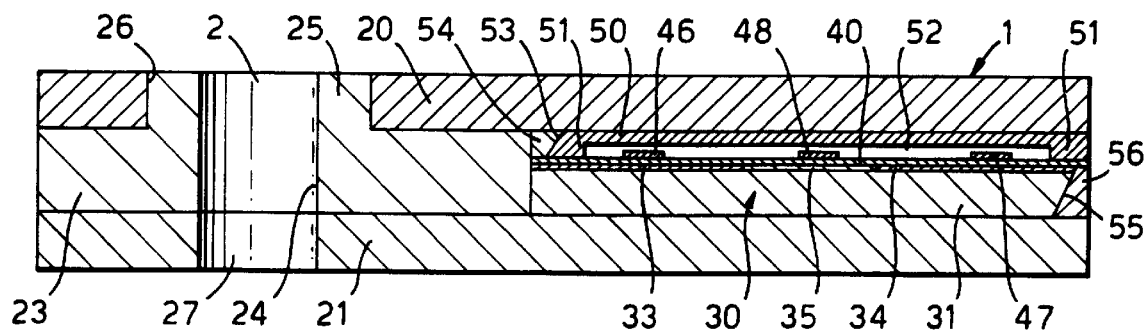
FIG. 2 is a cross sectional side-elevation view of the sensor assembly.
Figure 3:
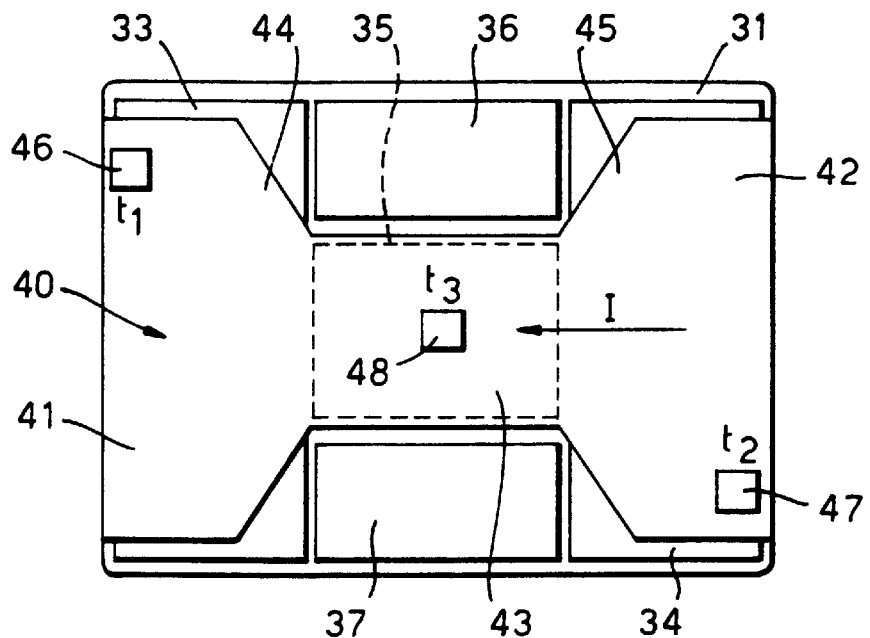
FIG. 3 is a plan view of a part of the sensor assembly.

With reference now also to FIGS. 2 and 3, the sensor assembly 1 comprises an upper and lower copper plate 20 and 21, which form the upper and lower surfaces of the assembly. The two plates 20 and 21 are separated from one another by a microengineered wafer assembly 30 and an electrically-insulative ceramic spacer 23. The spacer 23 is of aluminum oxide and is of rectangular shape with an aperture 24 and a collar 25 projecting upwardly around the aperture. The collar 25 fits within an aperture 26 in the upper plate 20, the aperture 24 in the spacer aligning with an aperture 27 in the lower plate 21. The aperture 27 in the lower plate 21 and the aperture 24 in the spacer 23 together form the aperture 2 in the sensor assembly 1, so that the terminal post 4 can make electrical contact with the edge of the aperture in the lower plate but is insulated from contact with the upper plate 20.

The wafer assembly 30 is located to the right of the spacer 23 and includes a lower silicon substrate 31 with a metallized lower surface 32 soldered to the upper surface of the lower plate 21. Two diamond interlayers 33 and 34 extend across the width of the upper surface of the substrate 31 at opposite ends, being separated from one another by about one third the length of the substrate. The diamond interlayers 33 and 34 are thermally conductive but electrically insulative. The space between the two interlayers 33 and 34 is occupied by a central pad 35 of a thermally-insulative material and by two side regions 36 and 37 containing processing electronics for the sensor assembly formed in the silicon substrate by conventional integrated circuit techniques. A thin layer 40 of an electrically-conductive material, such as silver, is deposited on top of the diamond interlayers 33 and 34 and the central pad 35, the layer typically being about 12 micrometers thick. The layer 40 extends the entire length of the substrate 31 and varies in width along its length so that its cross-sectional resistance varies correspondingly. More particularly, the two ends 41 and 42 of the layer 40 extend substantially across the entire width of the substrate 31 whereas the central region 43 overlying the pad 35 occupies only about the central one third of the width of the substrate. The length of this central region 43 is about one third that of the layer 40 and is separated from the end regions 41 and 42 by respective tapering regions 44 and 45, so that the layer 40 has a bow-tie shape. The resistance between opposite ends of the layer 40 is typically about 0.003 ohms.

Three temperature sensors 46 to 48 contact the upper surface of the silver layer 40. The sensors 46 and 48 may be manufactured by surface machining a layer of a semiconductor deposited on the upper surface of the layer 40 to make it temperature sensitive. For example, the sensors may be band-gap devices. Alternatively, the temperature sensors could be formed in a part of the silicon wafer assembly 30 in contact with the underside of the silver layer 40, or they could be conventional discrete devices mounted in contact with the layer, such as similar to those sold by Analogue Devices under Part Number AD590. One sensor 46 is located in the wide region 41 at one end of the layer 40 towards one edge, another sensor 47 is located in the wide region 42 at the other end of the layer towards the opposite edge, and the third sensor 48 is located centrally in the narrow region 43 of the layer. The three sensors 46 to 48 are electrically connected to the two processing regions 36 and 37.

The wafer assembly 30 is completed by an upper silicon cap 50 having a downwardly-extending wall 51 around its periphery. The lower edge of the wall 51 is bonded to the upper surface of the substrate 31, so that the upper surface of the substrate is enclosed in an hermetically sealed cavity 52. The upper surface of the cap 50 is metallized and soldered to the underside of the upper plate 20.

Electrical connection to the layer 40 is made by etching a recess 53 through the left-hand end of the cap 50, so as to expose the upper surface of one end of the layer 40, and then filling the recess with solder 54 to form an electrical path between the upper plate 20 and the layer 40. A similar recess 55 is etched through the substrate 31 at its right-hand end to expose the lower surface of the other end of the layer 40, and then filling the recess with solder 56 to form a connection with the lower plate 21.

Figure 4:
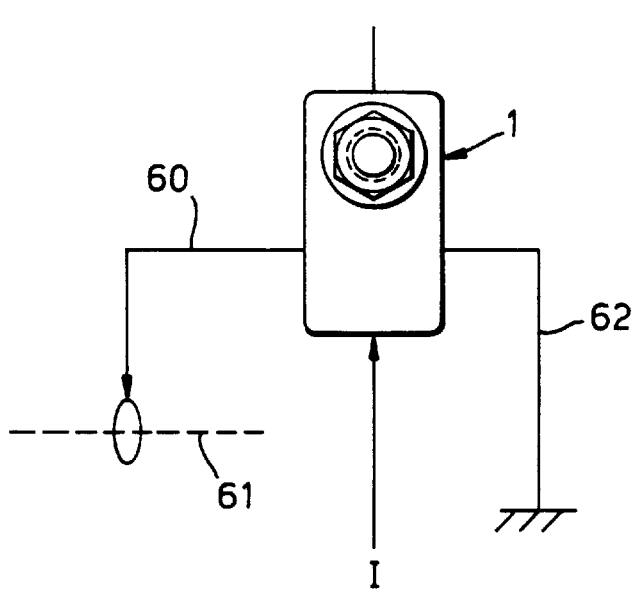
FIGS. 4 and 5 illustrate alternative ways of deriving outputs from the sensor assembly.
Figure 5:
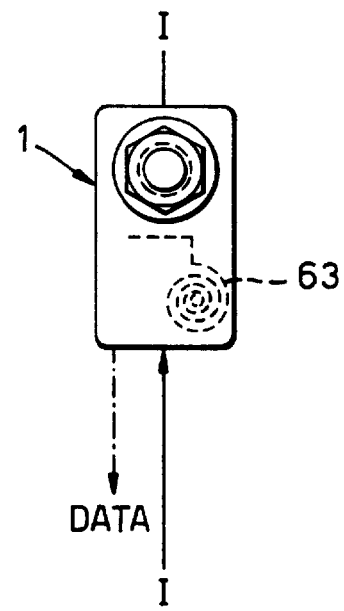

Current data can be supplied from the sensor assembly 1 via a separate wire 60, as shown in FIG. 4, to a databus 61. Low voltage power for the processing circuitry 36 and 37 can be supplied by separate low voltage wires (not shown) or it can be derived from the bar conductor 3 and a chassis earth connection 62. Alternatively, where the power line 3 supplies an alternating current, power for the sensor assembly 1 can be derived by an inductive pickoff 63 formed from a flat silicon coil in the sensor, as shown in FIG. 5. The problem with deriving power from the main power line itself is that, when there is no power between the conductor 3 and the cable 5, the sensor assembly 1 would be derived of power, so no output would be provided. This problem could be overcome by incorporating into the sensor assembly a rechargeable, thin film micro battery to provide a signal when line power is unavailable. Instead of supplying data via a separate line 60, it could be encoded and supplied along the power line itself, whether this be of a dc or ac type, as shown in FIG. 5.

When no current flows in the system, the temperatures $t_1$, $t_2$ and $t_3$ at the three temperature sensors 46 to 48 is approximately equal, so that the difference temperature: $t_3-(t_1+t_2)/2$, is approximately zero.

When current does flow in the system, this passes from the bar conductor 3 through the lower plate 21 and to the right-hand end of the silver layer 40 via solder 56 in the recess 55. Current then flows along the layer 40 to its left-hand end and to the upper plate 20 via solder 54 in the recess 53. For a current of 10 amps, the voltage drop across the sensor would be about 0.03 volts, with a power dissipation of about 0.25 watt. Current can then flow into the cable 5 via the pad 6. Current flow through the layer 40 causes its temperature to rise as a result of $I^2R$ losses in the conducting layer. The heating effect this produces, however, will not be even along the length of the layer. One reason for this is that the cross section resistance varies along the length of the layer. Also, the rate of heat dissipation is different at different points along the layer 40 because of the variation in surface area and the different thermal conductivities of the materials underneath the layer, the diamond interlayers 33 and 34 at the ends having a greater thermal conductivity than the insulating pad 35 under the central region 43 of the layer. As a result of these effects, the temperature $t_3$ of the central, narrow portion 43 of the layer 40 will be greater than the temperatures $t_1$ and $t_2$ at the wider ends 41 and 42 of the layer so the temperature difference $t_3-(t_1+t_2)/2$ will have a positive value that is approximately proportional to the square of the current at any instant. Typically, the power dissipation in the narrow, central part 43 of the layer 40 would be about 4.5 times that of each of the wider end regions 41 and 42. In fact, the relationship is more complex than this but the processing circuitry 36 and 37 compensates for this after calibration, such as by use of a simple look-up table, to provide an output signal representative of the equivalent current.

The diamond interlayers 33 and 34 serve other purposes than to increase the heat dissipation at the ends of the layer 40. They also serve to provide electrical insulation and help transmit medium term variations in ambient temperature to the interior of the sensor.

The low thermal mass of the sensing element 40 and 46 to 48 helps ensure a rapid response to current changes. By monitoring both $t_1$ and $t_2$, and using the average reading, the effect of the thermal path and temperature differences between the bar conductor 3 and the cable 5 is minimized. The system is more sensitive to high currents than to low currents because the temperature difference is proportional to the square of current; this is an advantage in power management systems. Sensor assemblies with different film resistances could be used for measuring different current ranges. The sensor assembly could be used to monitor other conditions. For example, a high terminal resistance might be indicated by conditions in which: $t_1>t_2$ and $t_1 \geq t_3$, or $t_2>t_1$ and $t_2 \geq t_3$. Dangerous overheating might be indicated by the condition in which $t_2>>t_1$ or $t_1>>t_2$.

The low cost of the sensor assembly enables it to be used, even in domestic appliances, where it is desirable to be able to monitor current, such as for control or safety purposes. The sensor assembly is very compact, it is mechanically robust and is tolerant of very high vibration and shock. The assembly is inherently safe since, under short circuit load conditions, the film would fuse open circuit at a predictable overload current, with all the fusing debris being contained within the structure of the wafer. The sensor assembly is non-polarized and can be used accurately to monitor alternating currents of any waveform, as well as direct currents since the assembly is responsive to the heating effect of the current.

What is claimed is:

1. A current sensor assembly of planar form arranged for connection in series with an electrical circuit, said circuit including a first and second conductor, said sensor assembly comprising:

a first conductive member adapted to contact said first conductor in said circuit;

a second conductive member adapted to contact said second conductor in said circuit;

a thin layer of conductive material connected at one end to said first conductive member and at another end to said second conductive member so that current flow in said circuit between said first and second conductors is via said thin layer;

a support for support said thin layer along its entire length, at least a part of said support contacting said thin layer being electrically insulative, and wherein the thermal conductivity of said support is different at different points along the length of said layer so that heat disposition is different at the different points and hence the temperature rise caused by current flow through said layer is different; and a plurality of temperature sensors located to sense the temperature of said layer at the different points, and wherein said assembly provides an output representative of current from the outputs of said temperature sensors.

2. A sensor assembly according to claim 1, wherein the support has a region along its length comprised of diamond.

3. A sensor assembly according to claim 1 or 2, wherein the first and second conductive members are planar members located on opposite surfaces of the assembly.

4. A sensor assembly according to claim 3, wherein the sensor assembly has an aperture extending through the first and second conductive members and adapted to receive a terminal post projecting from the first conductor, and that the second conductive member is electrically insulated from the terminal post by an electrically-insulative collar in the aperture.

5. A sensor assembly according to one of claim 1 or 2, characterised in that the sensor assembly includes three temperature sensors, the planar layer of conductive material is arranged such that the temperatures $t_1$ and $t_2$ at opposite ends are less than the temperature $t_3$ at a point between its ends, and the assembly includes a circuit for calculating $t_3-(t_1+t_2)/2$ and for deriving an indication of current accordingly.

6. A sensor assembly according to one of claim 1 or 2, wherein the output representative of current is provided via the electrical circuit itself.

\* \* \* \* \*